(12) United States Patent
Devlin

(10) Patent No.: US 9,900,027 B1
(45) Date of Patent: Feb. 20, 2018

(54) METHOD AND APPARATUS FOR DETECTING AND CORRECTING ERRORS IN A COMMUNICATION CHANNEL

(71) Applicant: Xilinx, Inc., San Jose, CA (US)

(72) Inventor: Benjamin S. Devlin, San Francisco, CA (US)

(73) Assignee: XILINX, INC., San Jose, CA (US)

( * ) Notice: Subject to any disclaimer, the term of this patent is extended or adjusted under 35 U.S.C. 154(b) by 83 days.

(21) Appl. No.: 14/693,415

(22) Filed: Apr. 22, 2015

(51) Int. Cl.
  *H03M 13/35* (2006.01)
  *H04L 1/00* (2006.01)
  *H04L 12/26* (2006.01)

(52) U.S. Cl.
  CPC .......... *H03M 13/353* (2013.01); *H04L 1/004* (2013.01); *H04L 43/0823* (2013.01)

(58) Field of Classification Search
  CPC ... H03M 13/353; H04L 1/004; H04L 43/0823
  See application file for complete search history.

(56) References Cited

U.S. PATENT DOCUMENTS

| | | | | |
|---|---|---|---|---|
| 2013/0205183 A1* | 8/2013 | Fillingim | ............ | G06F 11/1044 714/773 |
| 2013/0282953 A1* | 10/2013 | Orme | ............... | G06F 12/0238 711/102 |
| 2015/0180785 A1* | 6/2015 | Annamraju | ............. | H04L 47/25 370/230 |
| 2015/0288553 A1* | 10/2015 | Qi | ..................... | H03M 13/6306 375/340 |
| 2015/0363262 A1* | 12/2015 | Hu | ...................... | G06F 11/1044 714/773 |
| 2016/0028992 A1* | 1/2016 | Heatley | ................. | H04L 41/083 348/14.13 |
| 2016/0204811 A1* | 7/2016 | Goela | .................... | H04B 1/123 375/260 |

OTHER PUBLICATIONS

Fu, Harry, Xilinx, Inc. "Equalization for High-Speed Serial Interfaces in Xilinx 7 Series FPGA Transceivers", White Paper: 7 Series FPGAs, WP419 (v1.0) Mar. 27, 2012, pp. 1-18, San Jose, CA, USA.

(Continued)

*Primary Examiner* — Kyle Vallecillo
(74) *Attorney, Agent, or Firm* — Diana J. Rea; Kin-Wah Tong; Robert M. Brush

(57) ABSTRACT

A method, non-transitory computer readable medium and circuit for detecting and correcting errors in a communication channel are disclosed. The circuit includes error monitoring logic for monitoring the communication channel in real time for a performance metric, a fixed-operating point encoder/decoder coupled to the error monitoring logic for generating a bit stream containing redundant data used for the detecting and correcting, a reconfigurable controller coupled to the fixed-operating point encoder/decoder, wherein a configuration of the reconfigurable controller determines an amount of the redundant data contained in the bit stream, and a data structure implemented in a logic fabric of the circuit and coupled to the error monitoring logic, for generating the configuration of the reconfigurable controller responsive to a value of the performance metric controller.

20 Claims, 3 Drawing Sheets

(56) References Cited

OTHER PUBLICATIONS

Ma, Sigiang, et al., "FPGA Implementation of High-Throughput Complex Adaptive Equalizer for QAM Receiver," Wireless Communications, Networking and Mobile Computing (WiCOM), 2012 8th International Conference on, pp. 1-4, Sep. 21-23, 2012.
Xilinx, Inc., Error Correction Checking (ECC) Core, Jan. 23, 2014 date accessed, San Jose, CA, USA, http://www.xilinx.com/products/intellectual-property/ECC.htm.
Xilinx, Inc., Forward Error Correction Solution, Jan. 23, 2014 date accessed, San Jose, CA, USA, http://www.xilinx.com/ipcenter/fec_index.
Xilinx, Inc., LogiCORE IP ECC v2.0, Product Guide for Vivado Design Suite, PG092, Oct. 2, 2013, pp. 1-35, San Jose, CA, USA.
Yu, Qiaoyan; et al., "Dual-Layer Adaptive Error Control for Network-on-Chip Links," Very Large Scale Integration (VLSI) Systems, IEEE Transactions on, vol. 20, No. 7, pp. 1304-1317, Jul. 2012.

\* cited by examiner

METHOD AND APPARATUS FOR DETECTING AND CORRECTING ERRORS IN A COMMUNICATION CHANNEL

FIELD OF THE INVENTION

The present disclosure generally relates to the field of digital communications and more particularly relates to error detection and correction for digital communications.

BACKGROUND OF THE INVENTION

Digital communications require error detection and correction capabilities in order to communicate over imperfect and/or noisy channels. For instance, channel noise may introduce errors during transmission of a message from a source to a receiver. Error detection techniques detect such errors, while error correction techniques enable the original message to be reconstructed free of the errors. These capabilities become increasingly important as communication speed and bandwidth requirements increase.

Many error detection and correction techniques rely on the transmission of redundant data, such as error correcting codes (ECCs) and cyclic redundancy checks (CRCs), with a message. The receiver uses the redundant data to check consistency of the delivered message, and to recover data determined to be corrupted. The amount of redundant data that is needed to detect and correct errors often depends on the channel noise that is present, which may vary over time due to environmental changes (e.g., rain, temperature, cloud cover, presence of other devices, and the like).

SUMMARY OF THE INVENTION

A circuit for detecting and correcting errors in a communication channel includes error monitoring logic for monitoring the communication channel in real time for a performance metric, a fixed-operating point encoder/decoder coupled to the error monitoring logic for generating a bit stream containing redundant data used for the detecting and correcting, a reconfigurable controller coupled to the fixed-operating point encoder/decoder, wherein a configuration of the reconfigurable controller determines an amount of the redundant data contained in the bit stream, and a data structure implemented in a logic fabric of the circuit and coupled to the error monitoring logic, for generating the configuration of the reconfigurable controller responsive to a value of the performance metric.

A method for detecting and correcting errors in a communication channel is disclosed. One example of the method monitors the communication channel in real time for a performance metric, and then maps a value of the performance metric to a configuration of a reconfigurable controller of a fixed-operating point encoder/decoder that generates a bit stream containing redundant data used for the detecting and correcting. The method sends a signal to the reconfigurable controller instructing the reconfigurable controller to adjust the configuration to a new configuration that is responsive to the mapping.

Other features will be recognized from consideration of the detailed description and the claims.

BRIEF DESCRIPTION OF THE DRAWINGS

Accompanying drawings show exemplary embodiments in accordance with one or more aspects of the disclosure; however, the accompanying drawings should not be taken to limit the disclosure to the embodiments shown, but are for explanation and understanding only.

To facilitate understanding, identical reference numerals have been used, where possible, to designate identical elements that are common to the figures.

DETAILED DESCRIPTION OF THE DRAWINGS

Figure 1:
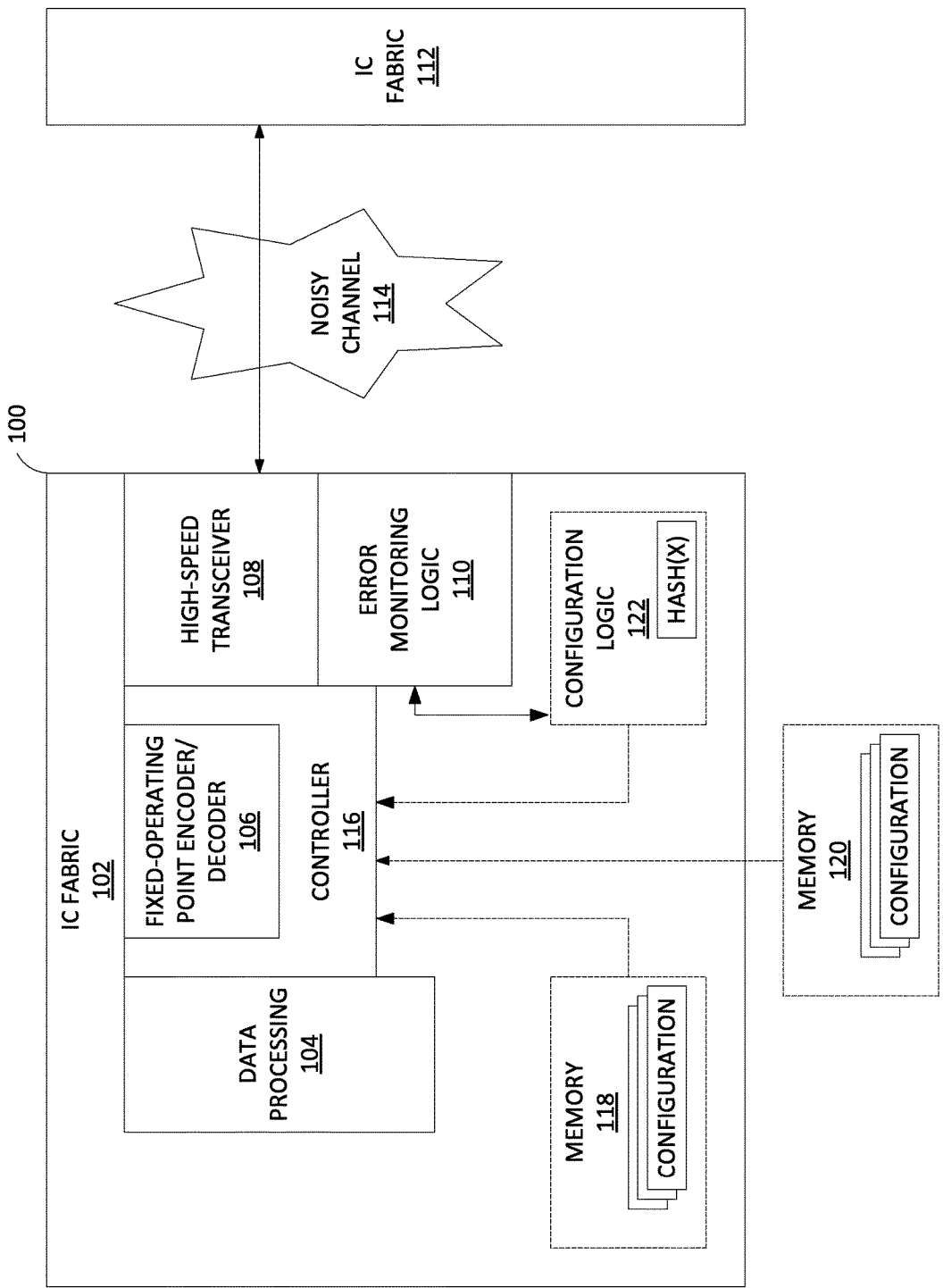
FIG. 1 illustrates an example circuit for performing error detection and correction.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated embodiment need not have all the aspects or advantages shown. An aspect or an advantage described in conjunction with a particular embodiment is not necessarily limited to that embodiment and can be practiced in any other embodiments even if not so illustrated, or if not so explicitly described.

The present disclosure broadly discloses a method, non-transitory computer readable medium, and a circuit for error detection and correction. As discussed above, many error detection and correction techniques rely on the transmission of redundant data, such as error correcting codes (ECCs) and cyclic redundancy checks (CRCs). The amount of redundant data that is needed to detect and correct errors often depends on the channel noise that is present, which may vary over time due to environmental changes. Sending less redundant data than is required may result in a failure to detect and/or correct errors. However, sending more redundant data than is required may unnecessarily decrease the throughput and energy-per-bit efficiency of the communication channel. One way to vary the amount of redundant data involves pre-programming an encoder/decoder tasked with generating the redundant data with a plurality of operating modes. A switch on the encoder/decoder allows the operating mode to be changed at any time to generate the appropriate amount of redundant data. However, because the encoder/decoder must be pre-programmed with every possible operating mode that may be required, it tends to consume a large amount of circuit area. This consequently decreases the throughput and energy-per-bit efficiency of the circuit.

One example of the present disclosure provides a method for detecting and correcting errors in a communication channel by monitoring the channel for a performance metric and then, responsive to the performance metric, updating an error detection and correction function (e.g., ECCs or CRCs) in the logic fabric of an integrated circuit (IC) in real time. Thus, the error detection and correction function is adaptive—i.e., it is reconfigurable in real time to meet channel requirements. The integrated circuit uses a fixed-operating point encoder/decoder. Within the context of the present disclosure, a "fixed-operating point" encoder/decoder is understood to be an encoder/decoder that is programmed with only one configuration at a time (e.g., as opposed to an encoder/decoder that is pre-programmed with multiple configurations between which it may switch). The configuration is specifically suited for the current operating point (communication channel conditions); however the configuration may be reprogrammed on the fly when the operating point changes by reprogramming a wrapper/controller of the fixed-operating point decoder, thereby allowing for circuit area and power consumption to be minimized while performance is maximized. For instance, rather than programming the IC to send error detection and correction codes in a bit stream of a specific, fixed size throughout operation, the IC may be reprogrammed in real time to update error detection and correction codes responsive to the changing conditions of the communication channel. Potential configurations for the fixed-operating point encoder/decoder are stored in memory in the logic fabric of the circuit rather than in the encoder/decoder, making efficient use of circuit area without impacting the circuit's throughput and energy-per-bit efficiency.

FIG. 1 illustrates an example circuit 100 (e.g., implemented in part or in whole within a digital communication device) for performing error detection and correction. In one embodiment, the circuit 100 includes a logic fabric 102, which generally comprises a data processing circuit 104, a fixed-operating point encoder/decoder 106, a high-speed transceiver 108, and error monitoring logic 110.

The data processing circuit 104 comprises circuitry for processing data obtained by the circuit 100. This data may be received from a remote device over a communication channel or may include data stored in a local memory accessible by the data processing circuit 104.

The fixed-operating point encoder/decoder 106 is coupled to the data processing circuit 104 and comprises circuitry for converting data from a first format into a second format, and vice versa. The fixed-operating point encoder/decoder performs operations related to encoding data when the circuit 100 operates in a transmitting mode, and performs operations related to decoding data when the circuit 100 operates in a receiving mode. For instance, the fixed-operating point encoder/decoder 106 may perform operations related to standardization of data formats, improvement of communication speed, data security, and data compression, as well as operations related to error detection and correction.

As the name implies, the fixed-operating point encoder/decoder 106 is dedicated to a fixed operating point. However, the fixed-operating point encoder/decoder 106 may include a reconfigurable controller 116 whose configuration controls the reconfigurable encoder/decoder 106, at least with respect to error detection and correction operations. In this case, the configuration of the reconfigurable controller 116 may be replaced on the fly. This minimizes the size (circuit area) of the fixed-operating point encoder/decoder 106, which in turn minimizes power consumption and delay. The configuration can be generated for both transmitting and receiving modes of the circuit 100 independently. The reconfigurable controller 116 is programmed with only one configuration at any given time, but the configuration may be reprogrammed on the fly to implement any one of a plurality of possible configurations. Each possible configuration of the reconfigurable controller 116 is associated with a specific, pre-defined set of parameters related to the generation of a bit stream containing redundant data that is used for error detection and correction (e.g., ECCs and CRCs). These pre-defined parameters may include, for example, the amount of error detection performed by the fixed operating-point encoder/decoder 106, the amount of error correction performed by the fixed operating-point encoder/decoder 106, the location of errors in the bit stream, and/or the required throughput of the communication channel. For example, a given configuration of the reconfigurable controller 116 could program the fixed-operating point encoder/decoder 106 to detect up to 4 bits of errors from every 8 bits of data, and to correct for 2 of the erroneous bits. The fixed-operating point encoder/decoder 106 could be set to operate in this manner as long as the errors are interleaved (i.e., not consecutive). So, for these parameters, the number of redundant bits that need to be transmitted in the bit stream might be 2. Then, for every 8 bits of data to be transmitted, 10 bits of data in total (i.e., the 8 bits of data plus the 2 redundant bits) would be transmitted. Thus, a given configuration of the reconfigurable controller 116 may define the amount of redundant data to be transmitted in the bit stream.

In one example, the reconfigurable controller 116 can be reprogrammed to implement one of these possible configurations in order to meet the real time needs of a communication channel over which the circuit 100 communicates. Thus, the reconfigurable controller 116 may have direct connections to the configuration memory of the logic fabric 102 and circuit 100, which allows for low-latency, real time reconfiguration of the reconfigurable controller 116.

The high-speed transceiver 108 is coupled to the fixed-operating point encoder/decoder 106 and comprises circuitry for transmitting and receiving data (e.g., over a communication channel). The high-speed transceiver 108 also sends and receives bit streams including redundant data used for error detection and correction. In one example, the high-speed transceiver 108 is a radiation-hardened block.

The error monitoring logic 110 is coupled to the fixed-operating point encoder/decoder 106 via the reconfigurable controller 116 and to the high-speed transceiver 108 and comprises circuitry for monitoring a performance metric of a communication channel over which the circuit 100 communicates. In addition, the error monitoring logic 110 is responsible for determining the appropriate configuration of the reconfigurable controller 116 based on the real time conditions of the communication channel.

As discussed above, the configuration of the reconfigurable controller 116 may be reprogrammed on the fly to implement one of a plurality of possible configurations. In one example, the possible configurations for the reconfigurable controller 116 are pre-defined in memory. That is, a buffer random access memory (BRAM), a lookup table random access memory (LUT/RAM), or a similar data structure may map a plurality of different pre-defined configurations of the reconfigurable controller 116 to different values of the performance metric (e.g., Configuration X when the BER is five errors per second, Configuration Y when the BER is ten errors per second, Configuration Z when the BER is fifteen errors per second, etc.). In one example, the memory is implemented in a local memory 118 in the logic fabric 102. In another example, the memory is implemented in a remote memory 120. In an alternative example, the possible configurations are not pre-defined in memory, but are generated on the fly by configuration logic 122 implemented in the logic fabric 102, for instance using a hash function. In one example, the local memory 118, the remote memory 120, and the configuration logic 122 have at least one thing in common: none are in the data path (i.e., the path that traverses the high-speed transceiver 108, the fixed-operating point encoder/decoder 106, and the data processing circuit 104 within the circuit 100). As such, the implementation of the local memory 118, the remote memory 120, and the configuration logic 122 will have little or negligible effect on the throughput and energy-per-bit efficiency of the communication channel.

As illustrated in FIG. 1, the circuit 100 may communicate with another circuit 112 over a noisy communication channel 114. In order to detect and correct errors in data transmitted over the noisy communication channel 114, portions of the circuit 100 implement a method that generates bit streams of redundant data (e.g., ECCs or CRCs) adaptively, in response to the real time conditions of the communication channel 114.

Figure 2:
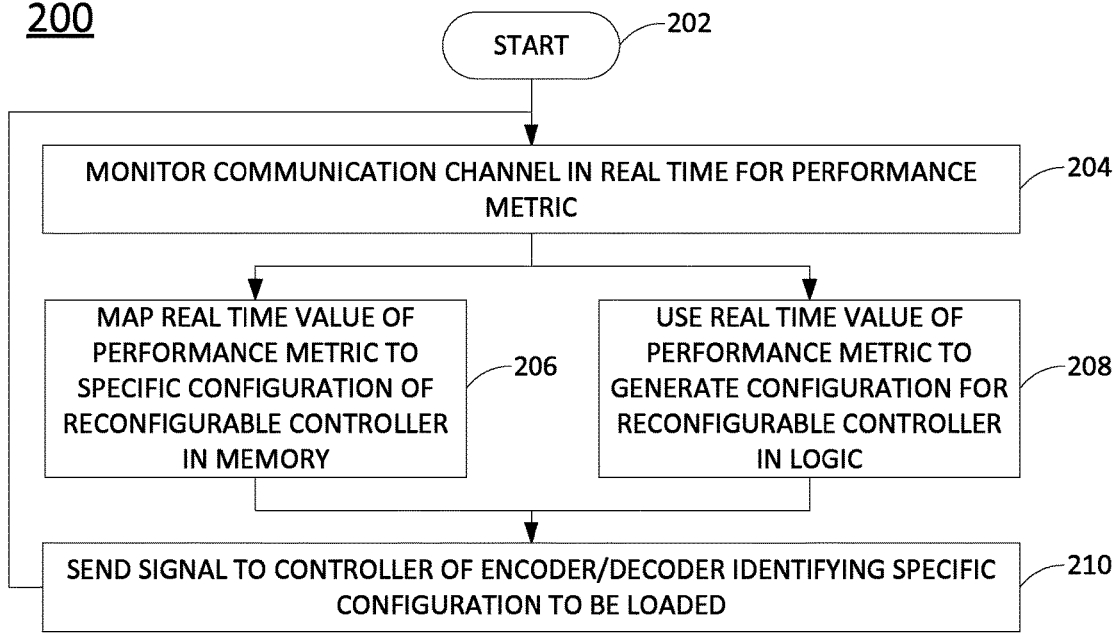
FIG. 2 illustrates a flowchart of a method for detecting and correcting errors on a communication channel.
Figure 4:
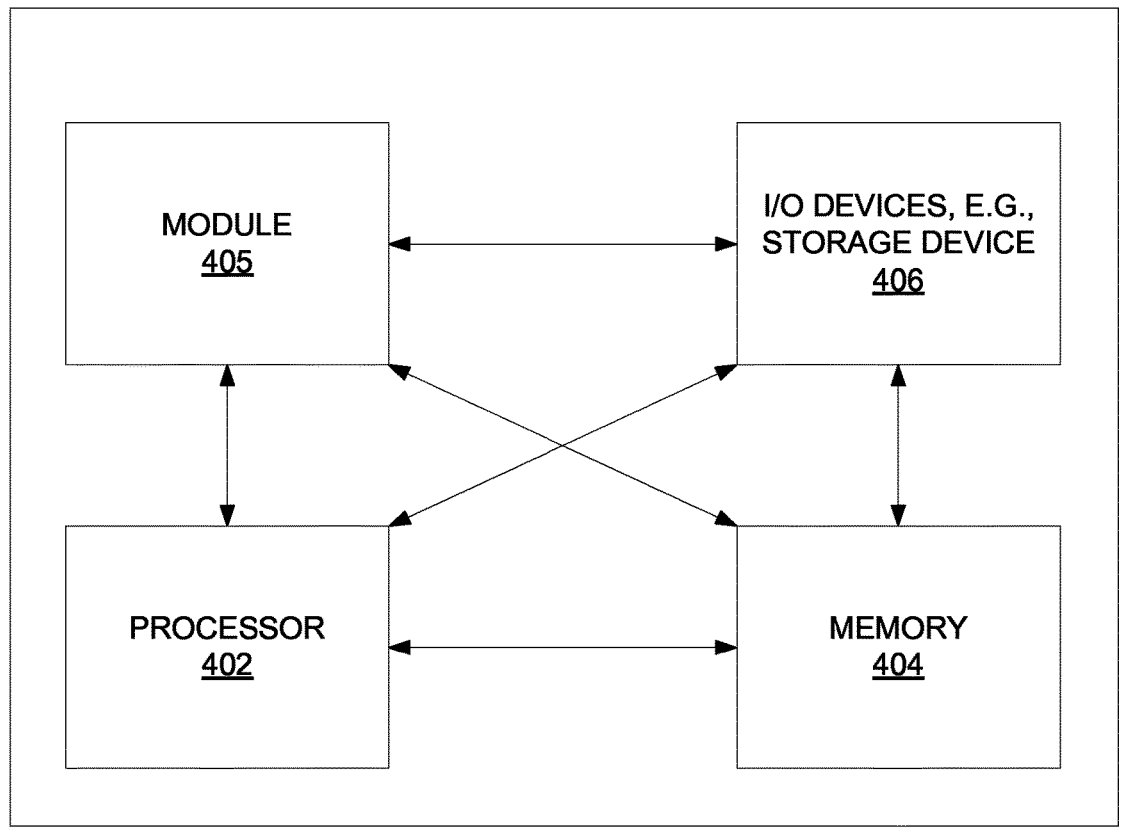
FIG. 4 illustrates a high-level block diagram of a general-purpose computer suitable for use in performing the functions described herein.

FIG. 2 illustrates a flowchart of a method 200 for detecting and correcting errors on a communication channel. In one embodiment, the method 200 may be performed by error monitoring logic of a circuit 100 as illustrated in FIG. 1 or by a processor of a computing device as illustrated in FIG. 4 and discussed below. For the purposes of explanation, reference is made in the discussion of the method 200 to various elements of the circuit 100 illustrated in FIG. 1; however, it will be appreciated that the method 200 could be performed by a circuit or device having a configuration that differs from the configuration illustrated in FIG. 1.

The method 200 begins at step 202. At step 204, the error monitoring logic 110 monitors a communication channel 114 in real time for a performance metric. The performance metric is some measure of the communication channel's conditions or operating point from which data error on the communication channel can be gauged. In one example, the performance metric is the bit error rate (BER) of the communication channel 114. The BER of the communication channel 114 is the number of bit errors (i.e., the number of bits received over the communication channel 114 that have been altered) divided by the total number of bits received over the communication channel 114 during a unit of time. In one example, the bit error rate is expressed as a percentage of the total number of bits (e.g., x %) or as a number of bits per second (e.g., y bits per second). In another example, the performance metric is a custom metric that is specific to a particular application (e.g., any user-defined metric). For instance, a custom performance metric could be the numerical size of the error in a calculation on the data being transmitted (e.g., where error is in tens of decimal places). In yet another example, the performance metric might be the maximum length of time for which consecutively occurring errors are detected. For instance, in audio/video streaming applications, some errors might be acceptable as long as they are not bursty (i.e., occurring in groups). In one example, the on-chip performance metric monitoring is performed by an external device, such as the circuit 112, which may be configured in a manner similar to the circuit 100.

Once the real time performance metric has been obtained, the method 200 may proceed in one of two ways. At step 206, the error monitoring logic 110 maps the current or real time value of the performance metric to a specific, predefined configuration of the reconfigurable controller 116 in memory. For instance, the error monitoring logic 110 may access a BRAM, a LUT/RAM, or a similar data structure implemented in local memory 118 or remote memory 120. In one example, the error monitoring logic 110 performs this mapping step 206 only when the performance metric meets some predefined threshold (e.g., when the BER meets or exceeds a maximum value). The predefined threshold may be user configurable. Thus, if the user expects a wide range of operating conditions, he or she could set the threshold to a very small value for fine-grained control. However, the amount of memory required will increase with the number of configurations that need to be stored.

Alternatively, at step 208, the error monitoring logic 110 may use the configuration logic 122 to dynamically generate a new configuration for the reconfigurable controller 116 that is responsive to the real time performance metric. For instance, the configuration logic 122 may use the real time performance metric as the input for a hash function that generates the new configuration. Dynamically generating the new configuration requires less overhead (since less data needs to be stored), but may require more dedicated circuitry (e.g., configuration logic 122). In one example, the error monitoring logic 110 performs this generating step 208 only when the performance metric meets some predefined threshold (e.g., when the BER meets or exceeds a maximum value).

At step 210, the error monitoring logic 110 sends a signal to the controller 116 of the reconfigurable encoder/decoder 106 identifying the configuration to be loaded (i.e., the configuration retrieved from memory in step 206 or generated dynamically in logic in step 208).

The method 200 then returns to step 204, and the error monitoring logic 110 continues to monitor the communication channel 114 for the performance metric. As the value of the performance metric fluctuates and crosses some predefined threshold, the error monitoring logic 110 will send signals to the reconfigurable controller 116 to adjust its configuration accordingly. Thus, the configuration of the reconfigurable controller 116 is responsive to the real time performance of the communication channel 114. By adaptively generating bit streams so that the quantity of redundant data is more precisely responsive to the real time conditions of the communication channel, the encoder/decoder circuit area may be reduced, and the throughput and the energy-per-bit efficiency of the communication channel can be improved without sacrificing data reliability.

Figure 3:
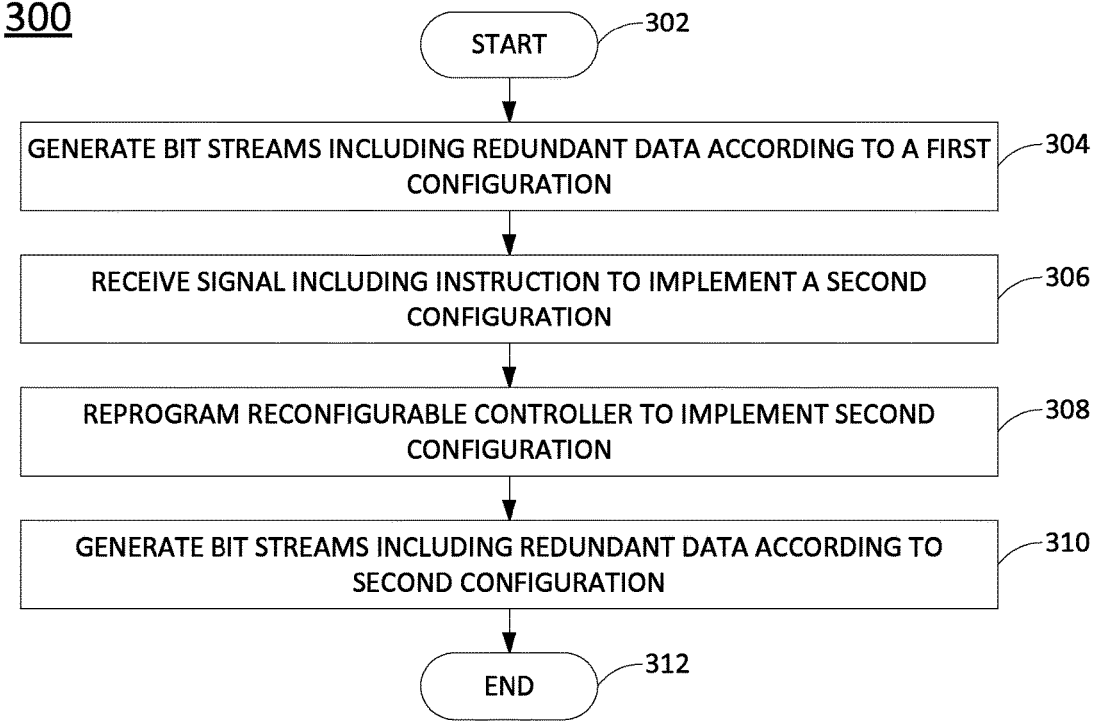
FIG. 3 illustrates a flowchart of another method for detecting and correcting errors on a communication channel.

FIG. 3 illustrates a flowchart of another method 300 for detecting and correcting errors on a communication channel. In one embodiment, the method 300 may be performed by a reconfigurable controller of a fixed-operating point encoder/decoder of a circuit 100 as illustrated in FIG. 1 or by a processor of a computing device as illustrated in FIG. 4 and discussed below. For the purposes of explanation, reference is made in the discussion of the method 300 to various elements of the circuit 100 illustrated in FIG. 1; however, it will be appreciated that the method 300 could be performed by a circuit or device having a configuration that differs from the configuration illustrated in FIG. 1.

The method 300 begins at step 302. At step 304, the reconfigurable encoder/decoder 106 generates bit streams including redundant data used for error detection and correction (e.g., ECCs and CRCs), according to a first configuration of the controller 116. The first configuration may specify a set of parameters related to the generation of the bit streams. For example, the first configuration may define the amount of redundant data to be transmitted in the bit streams.

At step 306, the controller 116 of the reconfigurable encoder/decoder 106 receives a signal from the error correction logic 110. The signal instructs the controller 116 to implement a second configuration that is different from the first configuration. The second configuration corresponds to a current condition of the communication channel 114 (e.g., corresponds to a specific BER). In one example, the signal identifies the specific second configuration to be implemented. As discussed above, the specific second configuration may be retrieved from a BRAM, LUT/RAM, or similar data structure that maps specific configurations of the reconfigurable controller 116 to specific values of a performance metric associated with the communication channel 114, or the specific second configuration may be a dynamically generated configuration that is responsive to a specific detected operating point of the communication channel 114.

At step 308, the controller 116 is reprogrammed to implement the second configuration, responsive to the signal received in step 306. At step 310, the reconfigurable encoder/decoder 106 generates bit streams including redundant data used for error detection and correction, according to the second configuration of the controller 116. The method 300 ends in step 312.

It should be noted that although not explicitly specified, one or more steps, blocks, or functions of the methods 200 and 300 described above may include a storing, displaying and/or outputting step as required for a particular application. In other words, any data, records, fields, and/or intermediate results discussed in the methods can be stored, displayed, and/or outputted to another device as required for a particular application. Furthermore, steps, blocks, or functions in FIGS. 2 and 3 that recite a determining operation, or involve a decision, do not necessarily require that both branches of the determining operation be practiced. In other words, one of the branches of the determining operation can be deemed as an optional step.

FIG. 4 depicts a high-level block diagram of a general-purpose computer or system suitable for use in performing the functions described herein. As depicted in FIG. 4, the system 400 comprises a hardware processor element (e.g., a CPU) or a hardware memory controller 402, a memory 404, e.g., random access memory (RAM) and/or read only memory (ROM), a module 405 for detecting and correcting errors on a communication channel and various input/output devices 406, e.g., any type of storage device, an output port, an input port and any number of interfaces.

It should be noted that the present disclosure can be implemented in software and/or in a combination of software and hardware, e.g., using application specific integrated circuits (ASIC), a general purpose computer or any other hardware equivalents, e.g., computer readable instructions pertaining to the method(s) discussed above can be used to configure a hardware processor to perform the steps or functions of the above disclosed method. In one embodiment, the present module or process 405 for detecting and correcting errors on a communication channel can be loaded into memory 404 and executed by hardware processor/controller 402 to implement the functions as discussed above. As such, the present process 405 for detecting and correcting errors on a communication channel as discussed above in method 400 (including associated data structures) of the present disclosure can be stored on a non-transitory (e.g., tangible or physical) computer readable storage medium, e.g., RAM memory, magnetic or optical drive or diskette and the like.

While the foregoing describes exemplary embodiments in accordance with one or more aspects of the present disclosure, other and further embodiments in accordance with the one or more aspects of the present disclosure may be devised without departing from the scope thereof, which is determined by the claims that follow and equivalents thereof. Claims listing steps do not imply any order of the steps. Trademarks are the property of their respective owners.

What is claimed is:

1. A circuit for detecting and correcting errors in a communication channel, comprising:

a fixed-operating point encoder/decoder coupled to the error monitoring logic for generating a bit stream containing redundant data used for the detecting and correcting, the fixed-operating point encoder/decoder including only a single operating point;

a reconfigurable controller coupled to the fixed-operating point encoder/decoder, wherein a configuration of the reconfigurable controller determines an amount of the redundant data contained in the bit stream for the single operating point of the fixed-operating point encoder/decoder;

error monitoring logic configured to monitor the communication channel in real time for a performance metric and to generate a signal to control the configuration of the reconfigurable controller based on a value of the performance metric; and a data structure circuit implemented in a logic fabric of the circuit and coupled to the error monitoring logic, for generating the configuration of the reconfigurable controller responsive to the signal generated by the error monitoring logic.

2. The circuit of claim 1, wherein the data structure circuit comprises a memory that maps a plurality of values of the performance metric to a plurality of pre-defined configurations of the reconfigurable controller.

3. The circuit of claim 2, wherein the data structure circuit is a buffer random access memory.

4. The circuit of claim 2, wherein the data structure circuit is a lookup table random access memory.

5. The circuit of claim 1, wherein the data structure circuit comprises a configuration logic that dynamically generates the configuration.

6. The circuit of claim 5, wherein the configuration logic implements a hash function.

7. The circuit of claim 1, wherein the performance metric is a measure of a condition of the communication channel that indicates a level of data error in the communication channel.

8. A method for detecting and correcting errors in a communication channel, comprising:

monitoring, by error monitoring logic of an integrated circuit, the communication channel in real time for a performance metric;

mapping, by the error monitoring logic, a value of the performance metric to a configuration of a reconfigurable controller of a fixed-operating point encoder/decoder of the integrated circuit that generates a bit stream containing redundant data used for the detecting and correcting, the fixed-operating point encoder/decoder including only a single operating point; and sending, by the error monitoring logic, a signal to the reconfigurable controller instructing the reconfigurable controller to adjust the configuration to a new configuration that is responsive to the mapping, the configuration determining an amount of the redundant data contained in the bit stream for the single operating point of the fixed-operating point encoder/decoder.

9. The method of claim 8, wherein the performance metric is a measure of a condition of the communication channel that indicates a level of data error in the communication channel.

10. The method of claim 8, wherein the performance metric is a bit error rate of the communication channel.

11. The method of claim 8, wherein the new configuration is predefined.

12. The method of claim 11, wherein the new configuration is specified by a data structure that is implemented in a logic fabric of the integrated circuit.

13. The method of claim 12, wherein the new configuration is associated with the value of the performance metric in a buffer random access memory.

14. The method of claim 12, wherein the new configuration is associated with the value of the performance metric in a lookup table random access memory.

15. The method of claim 8, wherein the new configuration is generated dynamically.

16. The method of claim 15, wherein the new configuration is generated in accordance with a hash function.

17. The method of claim 8, wherein the configuration is associated with a pre-defined set of parameters related to a generation of the bit stream.

18. The method of claim 17, wherein the set of parameters specifies an amount of the redundant data contained in the bit stream.

19. The method of claim 8, wherein the performance metric is received in a signal from another device with which the integrated circuit communications over the communication channel.

20. The method of claim 8, further comprising:
 implementing, by the reconfigurable controller, the new configuration; and
 generating, by the fixed-operating point encoder/decoder, a new bit stream according to the new configuration.

* * * * *